US011898920B2

(12) United States Patent
Berkel et al.

(10) Patent No.: US 11,898,920 B2
(45) Date of Patent: Feb. 13, 2024

(54) ELECTROMAGNETIC INTERFERENCE ABSORBING SENSOR CONNECTOR

(71) Applicant: Sensata Technologies, Inc., Attleboro, MA (US)

(72) Inventors: Engbertus Berkel, Wierden (NL); Thomas Gerjen Hendrik Kouwen, Oxnard, CA (US); Jonathan M. Rigelsford, Sheffield (GB)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 17/741,257

(22) Filed: May 10, 2022

(65) Prior Publication Data
US 2023/0366764 A1 Nov. 16, 2023

(51) Int. Cl.
G01L 19/00 (2006.01)
H05K 9/00 (2006.01)
G01L 19/14 (2006.01)

(52) U.S. Cl.
CPC ...... *G01L 19/0038* (2013.01); *G01L 19/0061* (2013.01); *G01L 19/147* (2013.01); *H05K 9/0073* (2013.01)

(58) Field of Classification Search
None
See application file for complete search history.

(56) References Cited

U.S. PATENT DOCUMENTS

| 4,404,125 | A | 9/1983 | Abolins et al. |
| 9,915,577 | B2* | 3/2018 | Strott .................. G01L 9/0042 |
| 10,793,698 | B2 | 10/2020 | Choi et al. |
| 2013/0248024 | A1* | 9/2013 | Dunn .................. H02N 1/08 73/753 |
| 2019/0003913 | A1* | 1/2019 | Hanley ............... G01L 19/142 |
| 2019/0078953 | A1* | 3/2019 | Huo .................... G01L 9/0055 |
| 2021/0148778 | A1* | 5/2021 | Stopel ................. G01L 19/142 |

FOREIGN PATENT DOCUMENTS

| EP | 2294378 A1 | 3/2011 |
| JP | S6213444 A | 1/1987 |
| JP | 2004216931 A | 8/2004 |
| WO | WO2009/153737 A1 | 12/2009 |
| WO | WO2020/111709 A1 | 6/2020 |

OTHER PUBLICATIONS

The Extended European Search Report and Written Opinion dated Sep. 11, 2023 for European patent application No. 23171434.6, 12 pages.

* cited by examiner

Primary Examiner — Brandi N Hopkins
Assistant Examiner — Nigel H Plumb
(74) Attorney, Agent, or Firm — Lee & Hayes, P.C.

(57) ABSTRACT

A connector for use with a sensor, such as a pressure sensor, has EMI absorbing capabilities. The connector includes a polymeric body configured for coupling to a sensor body and an EMI absorbing material. The EMI absorbing material may be entrained in the polymeric body, coated on the polymeric body, or otherwise integrated with the polymeric body. The EMI absorbing material may be carbon black or carbon nanotubes.

20 Claims, 6 Drawing Sheets

ELECTROMAGNETIC INTERFERENCE ABSORBING SENSOR CONNECTOR

BACKGROUND

Pressure sensors, and sensors generally, are susceptible to the negative effects of electromagnetic interference or electrical disturbances. For example, pressure sensors convert pressure into an electrical signal which can be interfered with by electromagnetic energy arising from another source and passing through the path of the electrical signal, causing interference with the operation of the receptor. There have been a number of approaches taken to protect sensors from electromagnetic interference. Many of the approaches incorporate shields to encase the circuit (i.e., sealing circuits) and grounds to establish an electrically conductive path away from the sensor. Additionally, sensors may be selectively placed in locations reducing emissions and/or making the equipment less vulnerable. Many drawbacks exist in the current solutions such as requiring additional equipment, increasing manufacturing costs, and increasing the side of the sensor to list a few.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1:
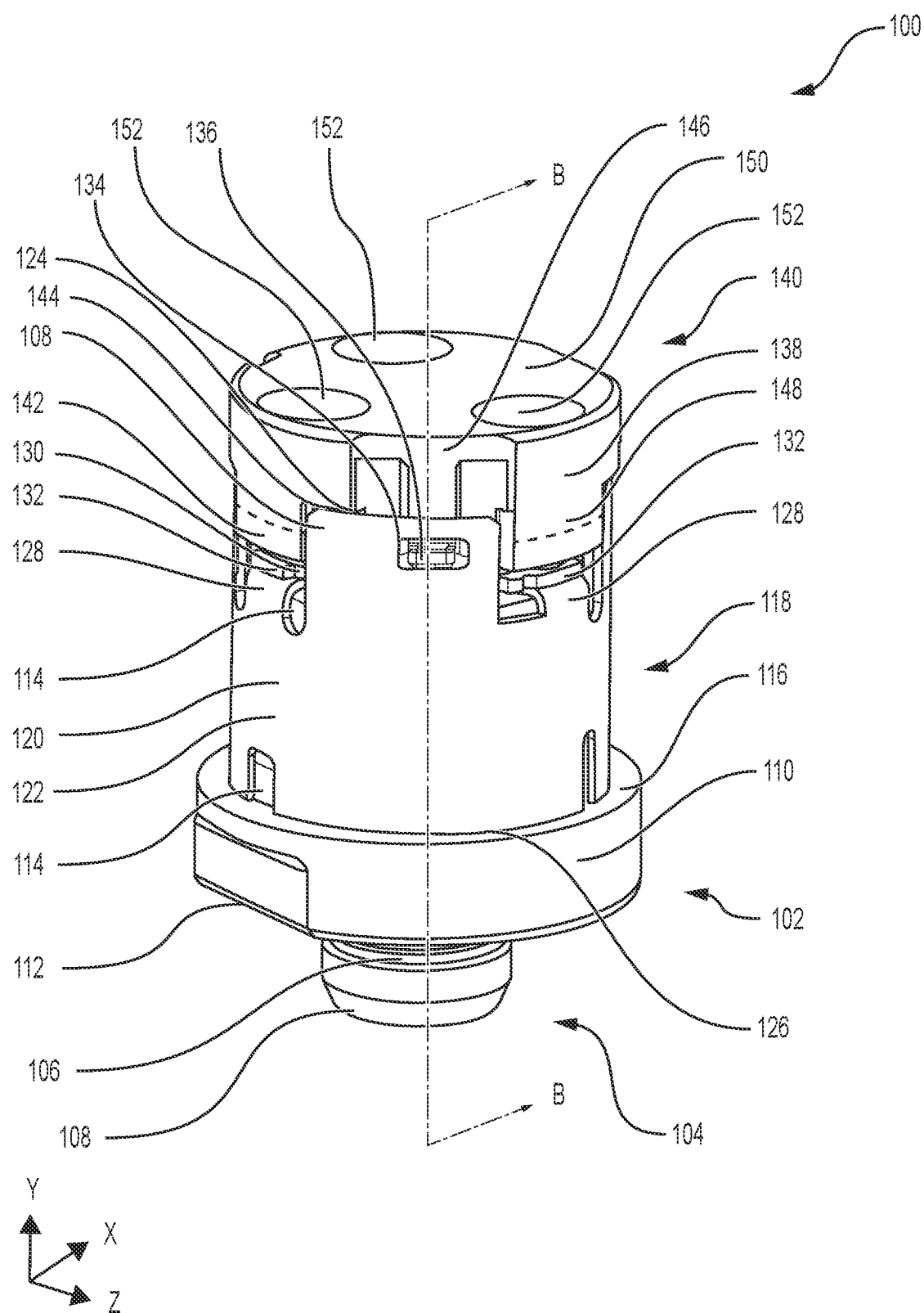
FIG. 1 illustrates a perspective view of an example sensor, according to an example of the present disclosure.

This disclosure is directed to, at least in part, a connector for use with a sensor, such as a pressure sensor. Conventionally, sensors, including pressure sensors, are multi-part assemblies made of a number of materials, including, generally, a sensing element and sensing electronics, a housing, and a connector. The connector facilitates attachment of the sensor to electronic components, such as cables, wires, harnesses, plugs, or the like. Conventionally, such connectors are made of a plastic or other non-conductive material, e.g., to reduce weight, reduce material and manufacturing cost, and/or the like. However, as a result of the materials used, the connector often is the only portion of a sensor that is electromagnetically open to the environment. Accordingly, external electrical fields may readily pass through the connector and couple into the sensitive internals of the sensor. As a result, sensor functionality can become degraded under exposure to such fields.

Some conventional systems have incorporated shielding to reduce the effects of electrical and/or electromagnetic fields. While shielding may, in some instances, reduce the impact of such fields on sensor components, shielding generally only reflects signals. These reflected signals may still bounce around in a larger system, potentially interfering with other components in the system. Moreover, signals at certain frequencies can lead to resonance, where the field strength increases, sometimes dramatically, relative to the external field, further exacerbating the interference.

Aspects of this disclosure are particularly associated with reducing interference from external electrical and/or electromagnetic fields. For instance, aspects of this disclosure relate to an improved pressure sensor that is configured to absorb electromagnetic interference (EMI). For examples, aspects of this disclosure include an improved connector and/or connector assembly. In some examples, the polymer connector may include a polymeric body entrained with an EMI absorbing material. Also in some aspects, the polymer connector may be at least partially coated with an EMI absorbing insert. In at least some examples, the connector may absorb EMI without requiring additional components to be introduced into the sensor. Specifically, the connector may maintain the original size, shape, and/or manufacture of the pressure sensor while conferring EMI absorbing capabilities. In still further examples, a sensor according to aspects of this disclosure can include a support made of an EMI absorbing material that is coupled to the connector. For instance, the connector may include a hollow, cylindrical portion that covers a top portion of the sensor, and an EMI-absorbing supporting ring may be provided to further absorbing EMI passing through the connector.

In examples of this disclosure, the pressure sensor includes a pressure port which couples the sensor to a pressurized volume. The pressure sensor may include a lower, threaded portion and/or a seating ridge to facilitate coupling of the sensor to the pressurized volume. The lower portion of the pressure port may have a set of side depressions configured to mate to a tool, the tool facilitating a secure coupling to the pressurized volume.

The pressure port also includes a middle portion and a top portion. The middle portion includes a first top surface that couples to a bottom edge of a support casing. The top portion of the pressure port is configured to be disposed within an inner surface of the support casing. The support casing forms a housing that further contains an electronic component. The electronic component is configured to receive and/or transmit signals and/or measure pressures from the pressurized volume. Accordingly or alternatively, a pressure sensing component may be independently coupled to the electronic component, the pressure sensing component sensing pressures and/or transmitting data to the electronic component. In some instances, the electronic component may transmit data along a wired coupling. In some other instances, the electronic component may transmit data wirelessly.

The support casing further couples a polymer connector to the pressure sensor. In some instances, the polymer connector facilitates sensor operations. As mentioned above and described further herein, the polymer connector is entrained with an EMI absorbing material. The polymer connector may be entrained with any EMI absorbing material including, but not limited to, carbon black (flakes), carbon nanotubes, carbon fiber, aluminum, copper, tin, nickel, and/or the like. In some instances, more than one EMI absorbing material may be used. In some other instances, selecting the EMI absorbing material may be dependent on an anticipated frequency range where a field reduction is required. Advantageously, entraining the polymer connector with the EMI absorbing material may reduce the number of components used in the pressure sensor. For example, entraining the EMI absorbing material, which dually operates to absorb radio frequency (RF) signals, into the polymer connector may eliminate the need for a redundant and/or additional component singularly operating as an RF absorber.

In some instances, the polymer connector may be coated with an EMI absorbing material. The coating may be located on an outer periphery of the polymer connector. In some other instances, the coating may be applied to an interior surface of the polymer connector. In some instances, the coating may be applied to the polymer connector via dip, brush, roll, spray, spin, and/or flow coating. The coating may include the same or similar EMI absorbing materials as described above and herein. Additionally, the coating may operate similarly to the entrained polymer connector as described above and herein. The coating may cover at least a portion of the polymer connector. Without limitation, the coating may be used in conjunction with the entrained polymer connector.

In some aspects, the polymer connector may a molded polymer connector. For instance, the connector may be molded from a polymer entrained with the EMI absorbing material. In at least some instances, an EMI absorbing material may be provided as an insert, with the connector being molded over the insert. In such examples, the polymer may or may not include the EMI absorbing material entrained therein. For instance, providing both the EMI absorbing insert and the EMI absorbing material entrained in the polymer may provide additional absorption, compared to one or the other. In some instances, the polymer connector may be molded via extrusion, compression, blow, injection, and/or rotational molding. The mold may include the same or similar EMI absorbing materials as described above and herein. Additionally, the mold may operate similarly to the entrained polymer connector as described above and herein.

The pressure sensor further includes a pressure chamber disposed within the pressure port. The pressure chamber couples to the electronic component and/or pressure sensing element, facilitating pressure sensing.

The polymer connector may further include an EMI absorbing connector sleeve. For example, the polymer connector may include an integrated hollow portion that extends down from the polymer connector. The hollow portion may further have disposed within it the top portion of the pressure sensor. As described herein, the sleeve may be entrained with an EMI absorbing material, include a coating, and/or include an EMI absorbing mold. The sleeve may be entrained, coated, or molded with an EMI absorbing material similarly as described above.

Although examples of this disclosure may be described in connection with a pressure sensor, a pressure sensor is but one example application. It should be appreciated that the EMI absorbing material and application thereof may be applied to any number and variety of sensors and EMI vulnerable equipment, components, or the like.

This disclosure further includes a method of manufacture. The method includes providing the pressure port. Next, the support casing is to be provided. Following the support casing, the electronics assembly is provided. Then a polymer is blended, into a composition blend, with an EMI absorbing material. The EMI absorbing material may be of one or more EMI absorbing materials as discussed above and alluded to herein. In some instances, it may be advantageous to use more than one EMI absorbing material. For example, combinations of EMI absorbing materials may be complimentary and provide increased absorption capabilities. Next, the polymer and EMI absorbing material blend is molded. From the mold, a sensor connector is made. The next manufacturing step is to assemble the components of the sensor.

The example EMI absorbing pressure sensor as described herein includes numerous benefits. Some of these benefits include improved EMI absorption, maintaining the original shape of the sensor, maintaining the original components of the sensor, increasing placement flexibility, and reducing the overall cost of the sensor. These and other benefits of the EMI absorbing pressure sensor will be apparent those of ordinary skill in the art.

The present disclosure provides an overall understanding of the principles of the structure, function, device, and system disclosed herein. One or more examples of the present disclosure are illustrated in the accompanying drawings. Those of ordinary skill in the art will understand that the devices and/or the systems specifically described herein and illustrated in the accompanying drawings are non-limiting examples. The features illustrated or described in connection with one example may be combined with the features of other examples. Such modifications and variation are intended to be included within the scope of the appended claims.

FIG. 1 illustrates a perspective view of a pressure sensor 100 according to an example of the present disclosure. The pressure sensor 100 includes a pressure port 102. The pressure port 102 may be a base of the pressure sensor 100 and facilitate attachment of the pressure sensor 100 to a pressurized vessel. For instance, the pressure port 102 includes a lower portion 104 having one or more threads 106 disposed at a distance above a seating ridge 108. The threads 106 may secure the lower portion 104 of the pressure port to a receiving port of a pressurized volume (not pictured). For example, the threads 106 may couple to a threaded receiving port and secure the pressure port 102 to the threaded receiving port. In some instances, the seating ridge 108 may be disposed at a lower end of the lower portion 104. In some instances, the seating ridge 108 may facilitate guiding the lower portion 104 into the receiving port of the pressurized volume. For example, the seating ridge 108 may contact a portion of the receiving port of the pressurized volume and guide and/or orient the lower portion 104 into the receiving port. Although the pressure sensor 100 is illustrated as including the threads 106, the pressure sensor 100 is not limited to threaded connections. For example, and without limitation, the pressure port 102 may be secured using one or more pressure fittings, detent fittings, locking fittings, or the like.

The pressure port 102 may further include a middle portion 110. In some instances, the middle portion 110 may be flanged relative to the lower portion 104 and may further include a first side depression 112 and a second side depression (not pictured). The first side depression 112 and the second side depression may facilitate easier coupling of the pressure port 102 to the receiving port of the pressurized volume. For example, the first side depression 112 and the second side depression may couple to a tool, e.g., a wrench, to facilitate coupling the pressure port 102 to the receiving port. A diameter and/or a cross-sectional dimension of the middle portion 110 may be larger than a diameter and/or a cross-sectional dimension of the lower portion 104. The diameter and/or the cross-sectional dimension of the middle portion 110 may also be larger than a diameter and/or a cross-sectional dimension of a top portion 114 of the pressure port 102. A difference between the diameter and/or the cross-sectional dimension of the middle portion 110 and the diameter and/or the cross-sectional dimension of the top portion 114 may expose a first top surface 116 on the middle portion 110. For instance, the top portion 116 may comprise a mounting surface on which components of the pressure sensor 100 may be disposed or to which components of the pressure sensor 100 may be mounted.

The pressure port 102 may be made of any suitable material including steel, copper, aluminum, tin, epoxy and ferrite powders, gold, nickel, silver, EMI absorbing metal, and/or the like.

As shown in FIG. 1, the pressure sensor 100 may further include a support casing 118. The support casing 118 may have a sidewall 120 including an outer surface 122, an inner surface opposite the outer surface 122, a top edge 124, and a bottom edge 126.

The support casing 118 may couple to the pressure port 102. In some instances, the bottom edge 126 of the support casing 118 may couple to or be disposed on the first top surface 116 of the middle portion 110 of the pressure port 102. The inner surface of the support casing 118 may further couple to the top portion 114 of the pressure port 102. In at least some examples, the inner surface of the support casing 118 may define a cylinder sized to receive the top portion 114 of the pressure port 102.

The support casing 118 may further include features for retaining the support casing 118 in a coupled engagement with the pressure port 102. In the example of FIG. 1, the support casing 118 includes a first set of clips 128, the first clips 128 spaced axially along the support casing 118 at a distance below the top edge 124. The first clips 128 may further couple the support casing 118 to an internal mass (depicted in more detail in FIGS. 2, 4, and 5). In some instances, the first clips 128 may comprise bent portions of the support casing 118, e.g., bent at approximately 90-degree angle, folded over for coupling to the internal top portion 114 of the pressure port or some other structure within the hollow housing of the support casing 118.

The support casing 118 may be made of any suitable material including steel, copper, aluminum, and/or the like. Without limitation, the support casing may be formed of sheet metal, e.g., cut, stamped, bent, and/or otherwise formed to create a desired shape, such as that shown in FIG. 1.

As shown in FIG. 1, an electronic component 130 may be disposed within hollow housing defined by the inner surface of the support casing 118. In some instances, the electronic component 130 may have a plurality of feet 132. In some further instances, the feet 132 may couple to a second top surface (depicted in more detail in FIGS. 2 and 4-5) of the first clips 128, coupling the electronic component 130 to the pressure sensor 100.

In some instances, the electronic component 130 may be coupled to a pressure sensing element (to sense a pressure of a coupled apparatus). For example, the electronic component 130 may be configured, at least partially, as a printed circuit board assembly. The electronic component 130 may be configured to receive a signal from the pressure sensing element and to process and/or transmit the signal.

As shown in FIG. 1, the support casing 118 may further include a plurality of notches 134 located on the sidewall 120 of the support casing 118, e.g., proximate the top edge 124. The notches 134 may be configured to receive a second set of clips 136, respectively. The second clips 136 may extend from a body 138 of a polymer connector 140 (i.e., a polymeric body), at a lower edge 142 of the body 138 of the polymer connector 140 and be configured to secure the polymer connector 140 to the support casing 118. In some instances, a middle edge 144 of the body 138 of the polymer connector 140 may be selectively disposed upon the top edge 124 of the support casing 118. In some other instances, a depressed surface 146 of the body 138 of the polymer connector 140 may be selectively disposed within the inner surface of the support casing 118. In some other instances, a cylindrical surface 148 of the body 138 of the polymer connector 140 may be disposed adjacent to the outer surface 122 of the support casing 118. In some further instances, the lower edge 142 of the polymer connector 140 may be disposed atop the electronic component 130 and secure the electronic component 130 within the pressure sensor 100. For example, the electronic component 130 may be disposed within the support casing 118 and between the polymer connector 140 and the internal mass. The body 138 of the polymer connector 140 may be further configured to facilitate sensors operations. For example, the body 138 may be coupled to the electronic component 130 and may further facilitate an external coupling that may allow for the pressure sensor 100 to operate and transmit a data.

For instance, in the example of FIG. 1, the polymer connector 140 may include a top surface 150 of the connector 140 includes a plurality of terminal ports 152. The terminal ports 152 may be configured to receive a plurality of male terminals or connectors, e.g., to facilitate a wired connection of the pressure sensor 100, e.g., to facilitate power and/or data transfer between (e.g., to and/or from) the pressure sensor and an external component. Although shown as facilitating a wired connection, in other instances the pressure sensor 100 may be configure for wireless transmission. For example, the electronic component 130 can include one or more wireless transmission components.

The form factor of the pressure sensor 100 is an example that may be generally known in the art. As noted above, the configuration of the pressure sensor 100 is but one example configuration. As also noted above, conventional sensors form the pressure port 102 and the casing 118 of metal, while the connector 140 is a polymeric component. Accordingly, in conventional arrangements, the pressure port 102 and the casing, because of their material properties, absorb EMI. However, the polymer connector 140 is electromagnetically open, allowing electric pules and electromagnetic pulses to enter the pressure sensor 100 therethrough, potentially negatively impacting functioning of the electrical components 130. Thus, in aspects of this disclosure, the connector 140 may be formed of a polymer entrained with an EMI material.

In some examples, the polymer connector 140 may be made of a polymer including, but not limited to, polyethylene (PE), polyvinylchloride (PVC), polypropylene (PP), and/or polyamide (PA). According to aspects of this disclosure, the polymer connector 140 may be further entrained with an electromagnetic interference (EMI) absorbing material. Advantageously, entraining the polymer connector 140 with an EMI absorbing material will allow the polymer connector to retain a conventional form, without requiring modification to the pressure sensor 100, while providing the benefit of absorbing EMI. Additionally, by entraining the polymer connector 140 with an EMI absorbing material, an external electrical field may be dampened, reduced, and/or blocked through absorption. Furthermore, through absorption, a field strength at a range of resonant frequencies, respectively, may be significantly decreased. In some instances, the field strength may also be reduced outside of the resonant frequencies while a magnitude of reduction may be dependent on the EMI absorbing material.

In some instances, the polymer connector 140 may be entrained with the EMI absorbing material between about 10% to about 25%. In some other instances, the polymer connector 140 may be entrained with the EMI absorbing material, preferably, between about 15% to about 20%. In some further instances, the polymer connector 140 may be entrained with the EMI absorbing material, more preferably, about 18%. In some instances, about may mean within a +/−0.5% deviation. In some other instances, about may mean within a +/−0.25% deviation. In some further instances, about may mean within a +/−0.1% deviation.

In another instance, the polymer connector 140 may, additionally or alternatively, include a coating coupled to an outer periphery of the polymer connector 140, the coating similarly entrained with or entirely composed of an EMI absorbing material. For instance, any of the surfaces of the polymer connector 140, including but not limited to the body 138, the top surface 150, surfaces of the terminal ports 152, and/or any other surfaces. In some instances, the coating may be coupled to the polymer connector 140 via dip, brush, roll, spray, spin, and/or flow coating. The coating may include the same or similar EMI absorbing materials as described above in the same or similar percentages. Additionally, the coating may operate similarly to the entrained polymer connector 140 as described above.

Figure 2:
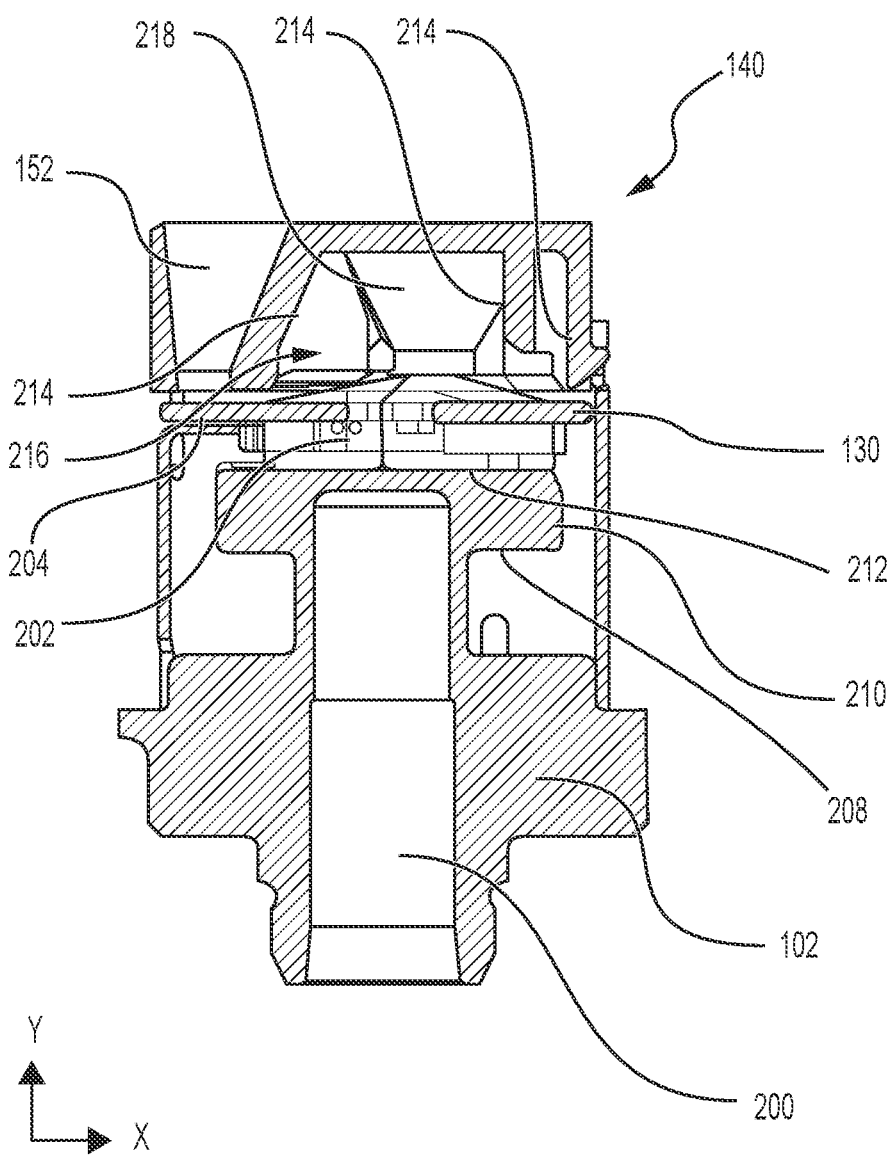
FIG. 2 illustrates a cross-sectional view of an example sensor using an electromagnetic interference (EMI) absorbing coating, according to an example of the present disclosure.

FIG. 2 illustrates a cross-sectional view of the pressure sensor 100 taken along the section line B-B in FIG. 1. As better illustrated in FIG. 2, the pressure sensor 100 includes a pressure chamber 200 centrally disposed within the pressure port 102 and extending from a bottom of the lower portion 104 to a distance below the top portion 114. The pressure chamber 200 may include an open-ended fluid-tight passageway in which to convey a fluid from a pressurized volume to a surface of a pressure sensing element 202 that senses the pressure. The pressure sensing element 202 may be coupled to the electronic component 130. FIG. 2 also illustrates the electronic component 130 coupled to a top of the clips 128. Accordingly or alternatively, the pressure sensing element 202 may be fully integrated into the electronic component 130 as to be indistinguishable as a separate component of the pressure sensor 100.

The top portion 114 of the pressure port 102 may, in some instances, include a radial "T" shape. As shown, the top portion 114 may be spaced from the inner surface of the casing 118, resulting in a space or void between a first bottom surface 208 of the radial "T" shape of the top portion 114 and the first top surface 116 of the middle portion 110. The T-shape may further include an outer surface 210 and an upper surface 212. The figure should be construed as merely one example of an arrangement, geometry, and/or construction of the pressure sensor 100. Accordingly and similarly, the radial "T" shape is merely an example geometry of the pressure port 102.

In some instances, the pressure sensing element 202 may be disposed between the upper surface 212 of the pressure port 102 and the electronic component 130.

FIG. 2 also better illustrates aspects of the polymer connector 140. Specifically, the body 138 of the connector 140 may include a plurality of interior surfaces 214 defining a cavity 216, e.g., between the terminal ports 152 and the clips 136. One or more of the interior surfaces 214 may comprise a conductive interior surface, e.g., formed by application of a coating 218 comprising an EMI absorbing material. In some instances, the coating may comprise a conductive backing applied to one or more of interior surfaces 214 of the polymer connector 140. In some further instances, the coating 218 may be coated on one or more of the surfaces via spray coating or the like. Although the coating 218 is illustrated as being disposed on one of the interior surfaces 214, in some other instances, the coating 218 may be applied to more and/or different surfaces. In some examples, the interior surfaces 214 on which the coating is applied may be based at least in part on a determination of vulnerable areas, areas of heightened EMI reception, and/or the like.

The coating 218 may be used in addition to the polymer connector 140 being entrained with an EMI absorbing material. Accordingly or alternatively, the EMI coating may be used with the polymer connector 140, the polymer connector 140 not being entrained with the EMI absorbing material. Advantageously, the EMI coating 218 may provide the polymer connector 140 and the pressure sensor 100 with EMI absorbing capabilities while introducing a negligible mass of material into the pressure sensor 100. Additionally, the pressure sensor 100 may benefit from the advantages of the EMI absorbing material while maintaining an original assembly, construction, and/or set of components. This may provide the pressure sensor 100 with EMI absorbing capabilities without increasing manufacturing costs. For example, the EMI coating 218 may provide the pressure sensor 100 with the EMI absorbing capabilities while the pressure sensor 100 may not need to be adjusted in geometry, size, material, and/or the like to accommodate an introduction of a non-negligible mass.

In some instances, the coating may be coupled to the polymer connector 140 via dip, brush, roll, spray, spin, and/or flow coating. The coating 218 may include the same or similar EMI absorbing materials as described above in the same or similar percentages. Additionally, the EMI coating 218 may operate similarly to the entrained polymer connector 140 as described above.

Figure 3:
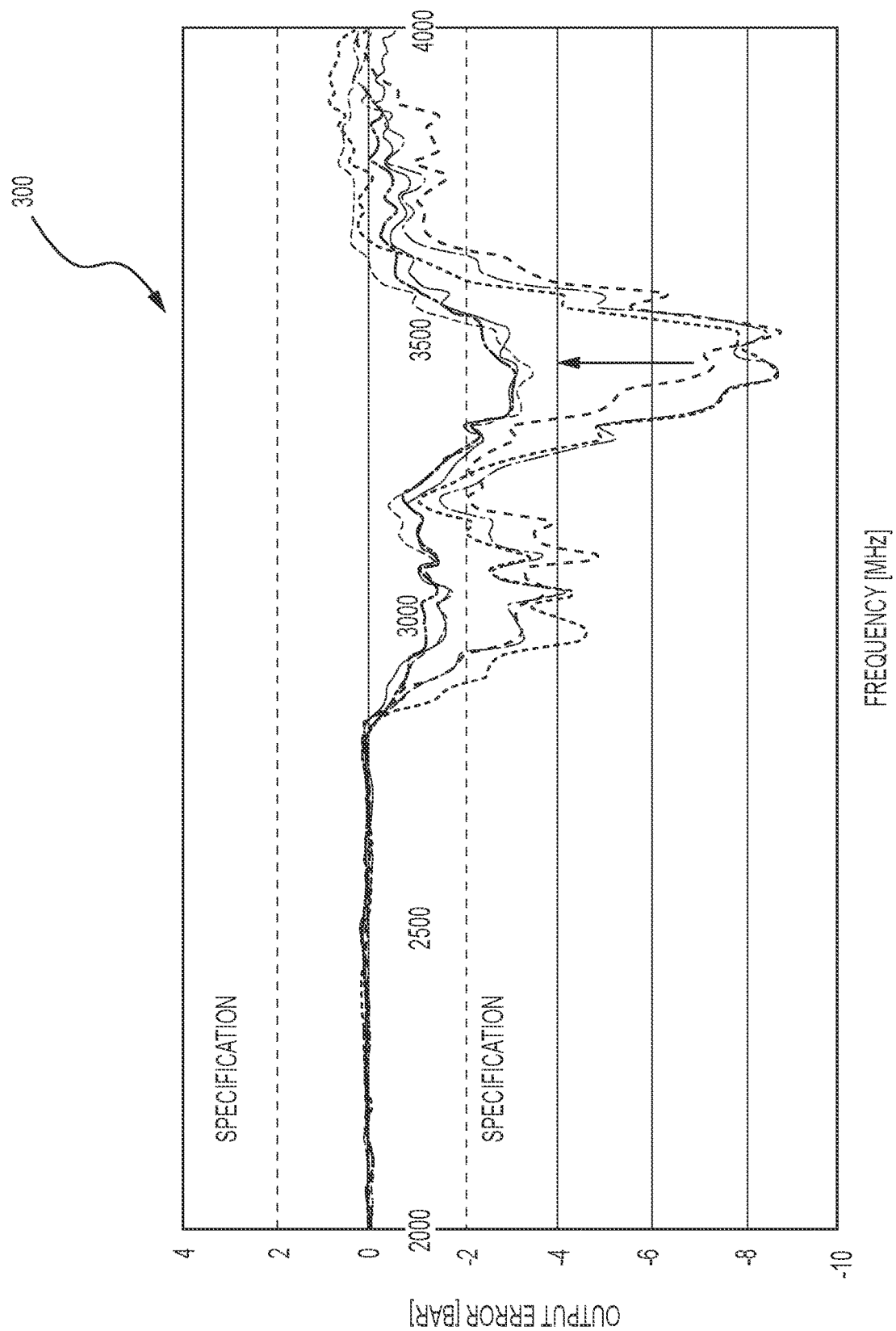
FIG. 3 illustrates a graphed data set of an example use case, according to an example of the present disclosure.

FIG. 3 a graphed data set 300 of an example use case, according to an example of the present disclosure. Tests, conducted with an example pressure sensor like the pressure sensor 100 including a polymer spring guide entrained with an EMI absorbing material, have resulted in about a >3.5-fold electromagnetic compatibility (EMC) improvement in a test pressure sensor. In some other instances, tests have resulted in about a 1.5-fold to about 5.5-fold EMC improvement. In some further instances, tests have resulted in a 2.5-fold to about a 4.5-fold EMC improvement. EMC is the ability of electrical equipment and systems to function acceptably in their respective electromagnetic environments. Limiting any unintentional generation, propagation, and/or reception of electromagnetic energy can similarly limit unwanted effects from the electromagnetic energy such as EMI or even physical damage.

For the example use case, graphed data set 300 depicted in FIG. 3, illustrated an output error for three sensors. Specifically, the graph shows error in an output of the pressure sensors when exposed to electromagnetic fields of varying frequency. The solid lines in the graph show the resulting error for the sensors using a conventional polymer connector and the dashed lines show the resulting error for the sensors using a polymer connector with entrained EMI absorber. Specifically, in the example of FIG. 3, the connectors were entrained with about 18% carbon black as an EMI absorbing material.

Although not plotted in the example of FIG. 3, similar tests using the coating 218 applied to one or more of the interior surfaces 214 of the polymer connector 140 have resulted in similar improvement. For example, the use of the coating 218 has resulted in improved performance by about 13% to about 17%. In some other instances, the combination may yield an improvement of about 15%. It should be appreciated that the combination disclosed above is representative of one example combination and that there may be any combination of EMI absorbing arrangements, discussed above and herein. Additionally, some other combinations may be further apparent to one skilled in the art. Each combination may further include its own respective percentage improvements from an example pressure sensor without EMI absorbing capabilities.

It is important that there can be a multitude of possible combinations, each yielding their own respective percentage improvements. This is because certain sensor components have their own associated susceptibility (i.e., tendency to malfunction and/or break down) to unwanted EMI emissions. In addition to susceptibility, coupling (i.e., a mechanism by which EMI reaches the component(s)) is another consideration. Together, a desired reduction and/or improvement, in percentage or otherwise, can be determined to ensure the efficacy, resilience, functionality, and etc. of the component. These details can inform a manufacture, assembly, combination, and/or the like of the pressure sensor with EMI absorbing and/or reflective capabilities. While ensuring the efficacy of a selected component, associated costs may be reduced. For example, knowing a desired improvement can prevent over shielding which may entail greater associated costs.

Figure 4:
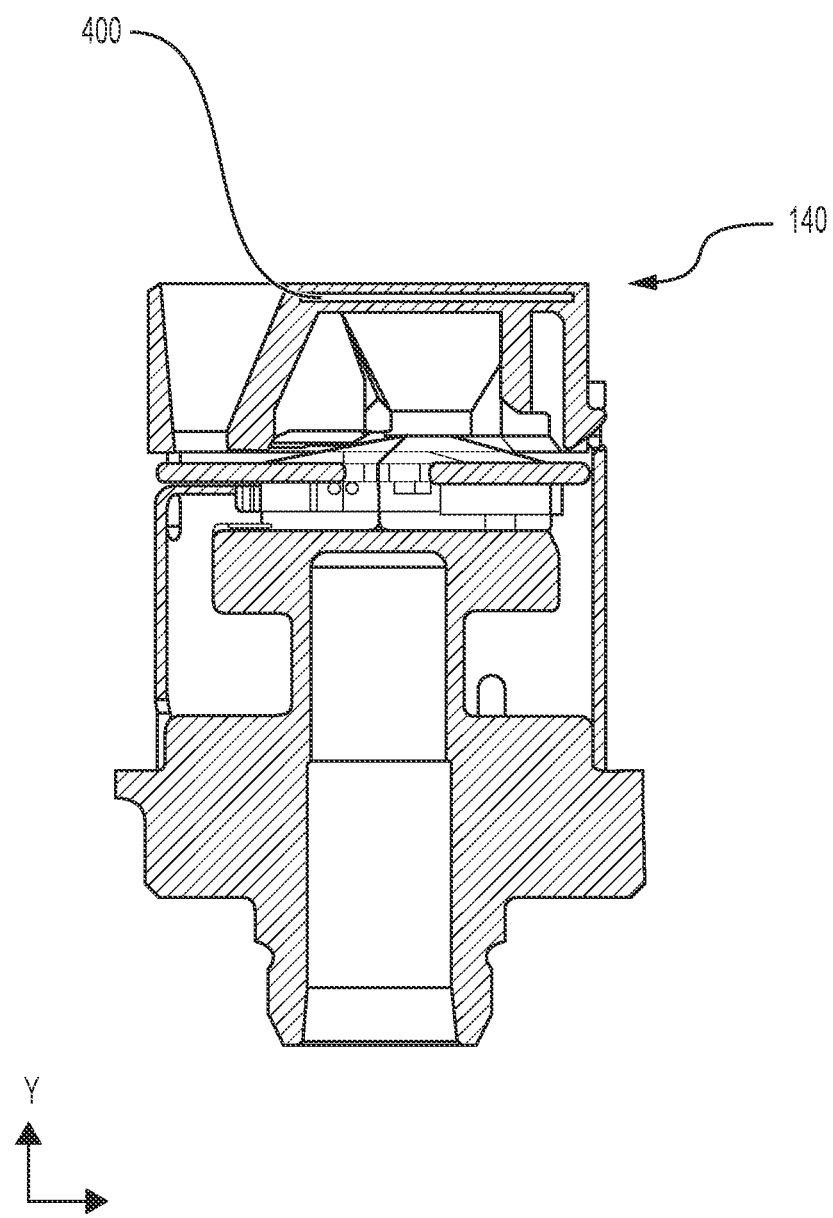
FIG. 4 illustrates a cross-sectional view of an example sensor using an EMI absorbing insert, according to an example of the present disclosure.

FIG. 4 illustrates a cross-sectional view of another example modification to the pressure sensor 100. In this example, the polymer connector 140 incorporates an EMI absorbing insert 400. Specifically, in this example, the polymer connector 140 is molded, e.g., as an overmold, around the EMI absorbing insert 400. The EMI absorbing insert 400 is illustrated in FIG. 4 as a horizontally-arranged plate disposed in the top 150 of the polymer connector 140. In examples, the insert 400 may be placed in a mold cavity, with the polymer (which may be a polymer entrained with an EMI-absorbing material) then provided to the mold cavity to at least partially encase the insert 400. In some instances, the polymer connector 140 may be molded via one or more of extrusion, compression, blow, injection, and/or rotational molding.

Although FIG. 4 shows the insert 400 in the top 150 of the polymer connector 140, the insert 400 may be disposed in one or more other sections of the insert 400. In practice, the insert 400 may be positioned in a relatively thicker area of the connector 104 and/or may be positioned for maximum EMI absorption. In addition, although only a single insert 400 is illustrated, more than one insert can be provided. Thus, the example of FIG. 4 provides the polymer connector 140 as an overmolded part with an integrated insert 400 for absorbing EMI.

The EMI absorbing insert 400 may be made of a cost-effective material (e.g., steel). In some other instances, the EMI absorbing insert 400 may, additionally or alternatively, be entrained with an EMI absorbing material. In some instances, the EMI absorbing insert 400 may be entrained with the EMI absorbing material between about 10% to about 25%. In some other instances, the EMI absorbing insert 400 may be entrained with the EMI absorbing material, preferably, between about 15% to about 20%. In some further instances, the EMI absorbing insert 400 may be entrained with the EMI absorbing material, more preferably, about 18%.

In some instances, the EMI absorbing insert 400 may, additionally or alternatively, include a coating one or more surfaces of the EMI absorbing insert 400. In some instances, the coating may be coupled to the surface via dip, brush, roll, spray, spin, and/or flow coating. The coating may include the same or similar EMI absorbing materials as described above in the same or similar percentages. Additionally, the coating may operate similarly to the entrained EMI absorbing insert 400 as described above.

Figure 5:
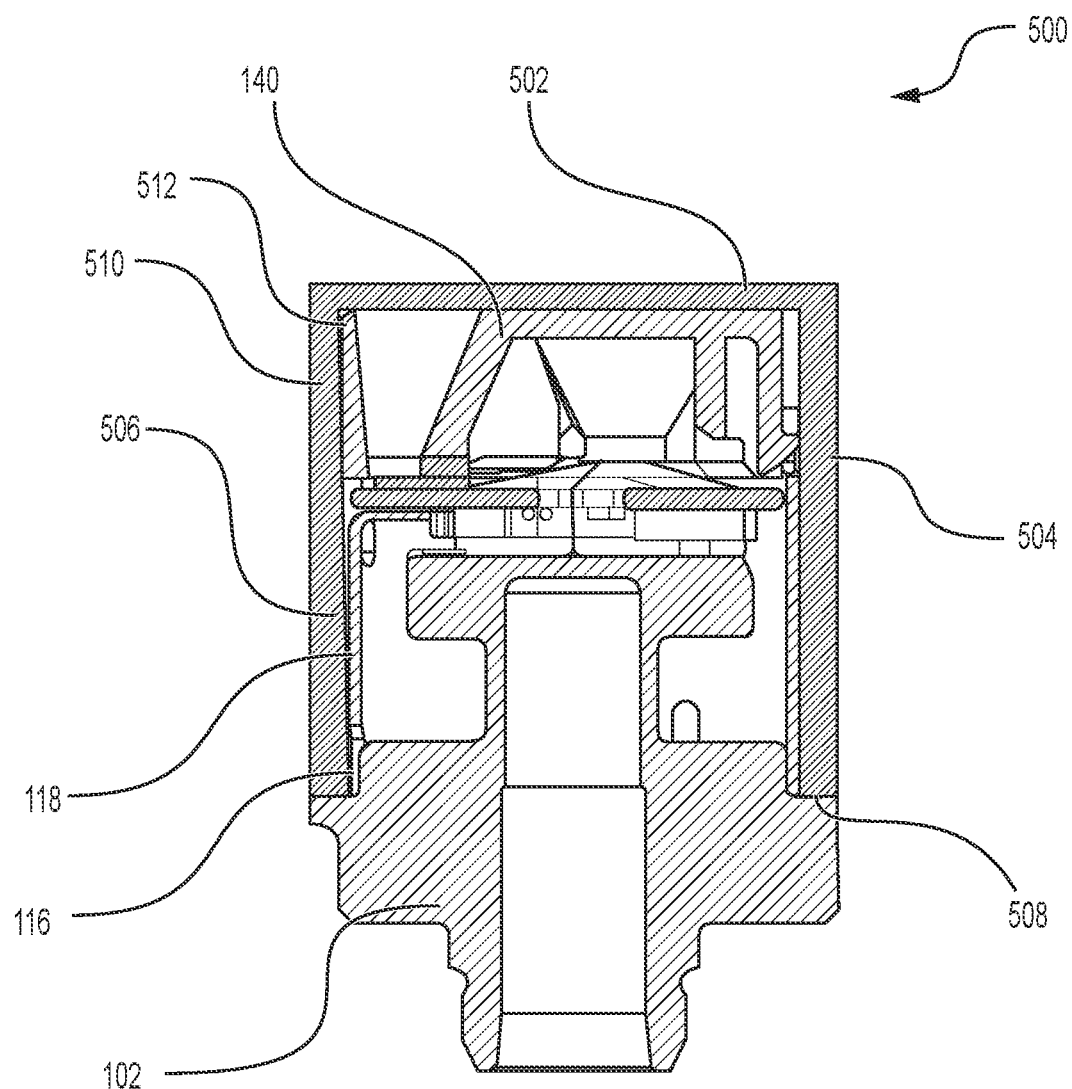
FIG. 5 illustrates a cross-sectional view of an example sensor using an EMI absorbing sleeve, according to an example of the present disclosure.

FIG. 5 illustrates a cross-sectional view of an example sensor using an EMI absorbing connector sleeve 500, according to an example of the present disclosure. The connector sleeve 500 is further shown to include a connector portion 502 and a hollow portion 504, the hollow portion 504 opposite the connector portion 502. The hollow portion 504 is further defined by a radial sidewall 506 extending from the connector portion 502 and an open rim 508. The open rim 508 further includes a thickness. The connector sleeve 500 is shown to couple to the pressure sensor 100, more specifically, the thickness of the open rim 508 is illustrated as coupling to the first top surface 116 of the pressure port 102.

As depicted, the connector sleeve 500 extends over the polymer connector 140, e.g., to envelope the polymer connector 140 and the casing 118. The connector sleeve 500 may be separate from the polymer connector 140, or the polymer connector 140 and the connector sleeve 500 may be formed as a single piece, e.g., a single mold. In some instances, the EMI absorbing sleeve 500 may cover at least a portion of the top portion of the sensor 100. In some other instances, the EMI absorbing sleeve 500 may cover at least a portion of the top portion and a lower portion of the pressure sensor 100.

The connector sleeve 500 may be entrained with an EMI absorbing material, coated with an EMI absorbing material, and/or have an EMI absorbing material disposed therein, generally as discussed in example above. The connector sleeve 500 may exhibit the same or similar EMI absorbing capabilities as described above and herein. Additionally, the connector sleeve 500 may include the same or similar material compositions as described above and herein.

In some further instances, the connector sleeve 500, either as the single or the separate component, may incorporate any combination of the connector sleeve 500 entrained with an EMI absorbing material, the connector sleeve 500 including the EMI coating 218, and/or the connector sleeve 500 including the EMI absorbing insert 400. As described herein, combinations of the EMI absorbing techniques improve an overall EMI absorbing efficacy. In some instances, the connector sleeve 500 may be entrained with an EMI absorbing material and include an EMI coating applied to the outside surface 510 of the connector sleeve 500.

Figure 6:
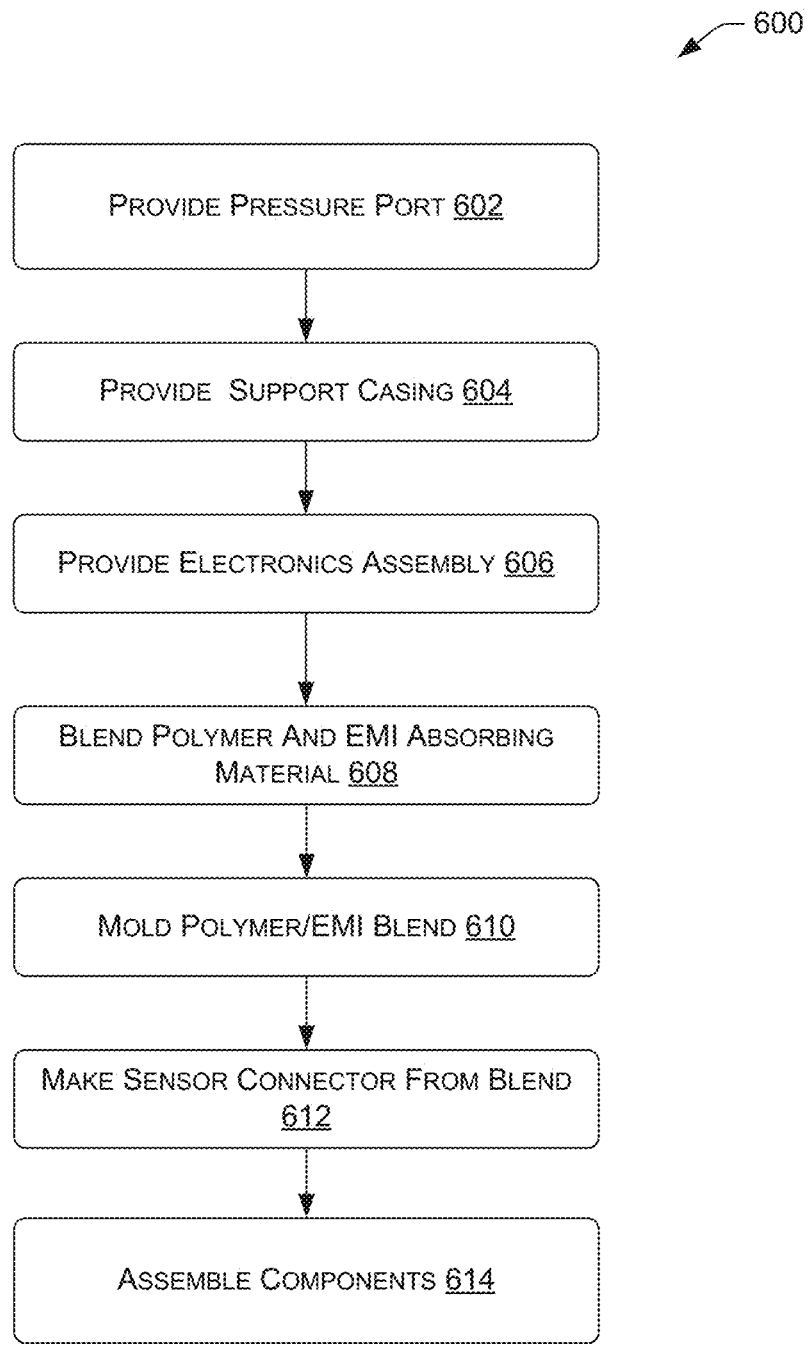
FIG. 6 illustrates an example method of manufacture of an EMI absorbing sensor, according to an example of the present disclosure.

FIG. 6 illustrates an example method of manufacture 600 of an EMI absorbing sensor, according to an example of the present disclosure. The method of manufacture 600 may begin by providing a pressure port 602. Following the step of providing a pressure port 602, providing a support casing 604. The next step includes providing an electronics assembly 606. Next, the following step includes blending a polymer and an EMI absorbing material 608. In some instances, the EMI absorbing material may be a filler, the filler being introduced into the blend with the polymer. The following step includes molding the polymer and EMI absorbing material blend 610. For example, this step may entail molding the polymer and EMI absorbing material in a pre-formed, connector mold. Next, the following step includes making a sensor connector from the blend 612. The next step includes assembling the components 614.

In some instances, during the blending a polymer and an EMI absorbing material 608 step, the amount of EMI absorbing material may be between about 10% to about 25%. In some other instances, the amount of EMI absorbing material may be, preferably, between about 15% to about 20%. In some further instances, the amount of EMI absorbing material used may be, more preferably, about 18%.

The EMI absorbing material includes, but is not limited to, carbon black (flakes), carbon nanotubes, carbon fiber, aluminum, copper, tin, nickel, and/or the like. In some instances, more than one EMI absorbing material may be used in conjunction with each other. In some other instances, selecting the EMI absorbing material may be dependent on an anticipated frequency range where a field reduction is required. Advantageously, blending the polymer with the EMI absorbing material may reduce the number of components used in the pressure sensor 100. For example, blending the EMI absorbing material, which dually operates to absorb RF signals, into the polymer may eliminate the need for a redundant and/or additional component singularly operating as an RF absorber.

It should be appreciated that the method of manufacture 600 discussed above is one example. As such, there may be any number of methods to achieve manufacture of an EMI absorbing sensor.

CONCLUSION

While various examples and embodiments are described individually herein, the examples and embodiments may be combined, rearranged, and modified to arrive at other variations within the scope of this disclosure.

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter.

What is claimed is:

1. A pressure sensor comprising:
a pressure port configured to couple to a pressurized volume;
a support casing coupled to the pressure port and defining a housing;
an electronic component disposed in the housing and configured to generate a signal corresponding to a pressure of the pressurized volume; and
a connector coupled to the electronic component and configured to connect to the support casing and send the signal;
wherein the connector comprises a polymer entrained with an electromagnetic interference (EMI) absorbing material, the EMI absorbing material including at least one of carbon black, carbon nanotubes, or carbon fiber.

2. The pressure sensor according to claim 1, wherein the polymer is entrained with from 10% to 25% carbon black.

3. The pressure sensor according to claim 1, further comprising an EMI absorbing coating disposed on the connector.

4. The pressure sensor according to claim 1, wherein the polymer is further entrained with a metal.

5. The pressure sensor according to claim 4, wherein the metal comprises at least one of aluminum, copper, tin, epoxy and ferrite powders, gold, nickel, silver, or steel.

6. The pressure sensor according to claim 1, wherein an internal surface of the housing comprises a conductive surface configured to absorb EMI.

7. The pressure sensor according to claim 6, wherein the conductive surface comprises at least one of an over mold, a molded surface, or a spray coating to absorb EMI.

8. The pressure sensor according to claim 6, further comprising a cover coupled to the support casing to at least partially cover the connector.

9. A connector for use with a pressure sensor, the connector comprising:
a polymeric body configured for coupling to a sensor body; and
an electromagnetic interference (EMI) absorbing material entrained in the polymeric body and configured to absorb EMI passing through the polymeric body.

10. The connector according to claim 9, wherein the EMI absorbing material comprises at least one of carbon black, carbon nanotubes, or carbon fiber.

11. The connector according to claim 10, wherein the EMI absorbing material comprises 10% to 25% carbon black entrained in the polymeric body.

12. A connector for use with a pressure sensor, the connector comprising:
a polymeric body configured for coupling to a sensor body; and
an insert including an electromagnetic interference (EMI) absorbing material configured to absorb EMI passing through the polymeric body,
wherein the polymeric body is molded over the insert.

13. The connector according to claim 12, wherein the insert is a metallic insert.

14. A connector for use with a pressure sensor, the connector comprising:
a polymeric body configured for coupling to a sensor body; and
a coating disposed on a surface of the polymeric body the coating comprising an electromagnetic interference (EMI) absorbing material configured to absorb EMI passing through the polymeric body.

15. The connector according to claim 9, further comprising:
a support ring at least partially contacting the polymeric body, wherein the support ring is comprised of a metal.

16. The connector according to claim 12, wherein the EMI absorbing material comprises at least one of carbon black, carbon nanotubes, or carbon fiber.

17. The connector according to claim 12, further comprising:
a support ring at least partially contacting the polymeric body, wherein the support ring is comprised of a metal.

18. The connector according to claim 14, wherein the EMI absorbing material comprises at least one of carbon black, carbon nanotubes, or carbon fiber.

19. The connector according to claim 14, further comprising:
a support ring at least partially contacting the polymeric body, wherein the support ring is comprised of a metal.

20. The connector according to claim 14, wherein the polymeric body is entrained with an additional EMI material.

* * * * *